United States Patent
Lavangkul et al.

(10) Patent No.: US 12,105,161 B2
(45) Date of Patent: Oct. 1, 2024

(54) LAYOUTS FOR INTERLEVEL CRACK PREVENTION IN FLUXGATE TECHNOLOGY MANUFACTURING

(71) Applicant: TEXAS INSTRUMENTS INCORPORATED, Dallas, TX (US)

(72) Inventors: Sudtida Lavangkul, Richardson, TX (US); Sopa Chevacharoenkul, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 119 days.

(21) Appl. No.: 16/503,660

(22) Filed: Jul. 5, 2019

(65) Prior Publication Data
US 2019/0331742 A1 Oct. 31, 2019

Related U.S. Application Data

(63) Continuation of application No. 15/042,119, filed on Feb. 11, 2016, now abandoned.

(51) Int. Cl.
| | |
|---|---|
| H10N 50/01 | (2023.01) |
| G01R 33/04 | (2006.01) |
| H10N 50/80 | (2023.01) |
| H10N 50/85 | (2023.01) |

(52) U.S. Cl.
CPC ............. *G01R 33/04* (2013.01); *H10N 50/01* (2023.02); *H10N 50/80* (2023.02); *H10N 50/85* (2023.02)

(58) Field of Classification Search
CPC ......... G01R 33/04; H01L 43/02; H01L 43/10; H01L 43/12; H10N 50/01; H10N 50/80; H10N 50/85

USPC .......................................................... 438/22
See application file for complete search history.

(56) References Cited

U.S. PATENT DOCUMENTS

| | | | | |
|---|---|---|---|---|
| 5,428,888 | A  * | 7/1995 | Hernandez-Ros | G01R 33/04 148/108 |
| 5,689,139 | A  * | 11/1997 | Bui | H01L 23/53209 257/758 |
| 6,229,307 | B1 * | 5/2001 | Umehara | G01R 33/02 324/244 |
| 6,404,192 | B1 | 6/2002 | Chiesi et al. | |
| 6,411,086 | B1 * | 6/2002 | Choi | G01R 33/04 324/253 |
| 6,472,868 | B1 * | 10/2002 | Takayama | G01R 33/02 324/249 |
| 6,650,112 | B2 * | 11/2003 | Takayama | G01R 33/02 324/249 |
| 6,759,845 | B2 | 7/2004 | Kang et al. | |

(Continued)

FOREIGN PATENT DOCUMENTS

JP 09318720 A 12/1997

*Primary Examiner* — Duy T Nguyen
(74) *Attorney, Agent, or Firm* — Andrew R. Ralston; Frank D. Cimino (57) ABSTRACT

An integrated fluxgate device includes a substrate that includes a dielectric layer. A fluxgate core is located over the dielectric layer. Lower windings are disposed in a lower metal level between the fluxgate core and the dielectric layer, and upper windings are disposed in an upper metal level above the fluxgate core. A metal structure in the upper metal level or the lower metal level overlaps an end of the fluxgate core and is conductively isolated from the upper and lower windings.

14 Claims, 8 Drawing Sheets

(56) References Cited

U.S. PATENT DOCUMENTS

| | | | |
|---|---|---|---|
| 6,822,437 B1* | 11/2004 | Hau-Riege | H01L 22/34 257/758 |
| 7,015,691 B2 | 3/2006 | Kang et al. | |
| 7,180,146 B2* | 2/2007 | Joisten | G01R 33/05 257/421 |
| 7,317,315 B2* | 1/2008 | Aizawa | G01C 17/30 324/247 |
| 7,414,399 B2* | 8/2008 | Delevoye | G01R 33/04 324/249 |
| 7,535,221 B2 | 5/2009 | Satoh | |
| 7,772,841 B2* | 8/2010 | Itoi | G01R 33/09 324/249 |
| 8,085,039 B2* | 12/2011 | Joisten | G01R 33/05 324/257 |
| 8,098,067 B2 | 1/2012 | Hasunuma | |
| 8,713,809 B2 | 5/2014 | Ohmori et al. | |
| 9,030,197 B1 | 5/2015 | Meske et al. | |
| 9,337,251 B2* | 5/2016 | Sturcken | H01L 28/10 |
| 9,577,185 B1* | 2/2017 | Lee | H01F 27/28 |
| 9,771,261 B1 | 9/2017 | Stringer et al. | |
| 9,870,858 B2* | 1/2018 | Lee | H01L 23/5226 |
| 9,947,450 B1 | 4/2018 | Peck, Jr. | |
| 10,017,851 B2 | 7/2018 | Lee et al. | |
| 10,147,537 B2* | 12/2018 | Lee | H01F 27/24 |
| 10,418,169 B2* | 9/2019 | Hamamura | H01F 27/2804 |
| 2002/0101683 A1* | 8/2002 | Katakura | G11B 5/17 360/123.34 |
| 2003/0006763 A1* | 1/2003 | Takayama | G01R 33/02 324/249 |
| 2003/0169037 A1 | 9/2003 | Kang et al. | |
| 2003/0169038 A1 | 9/2003 | Kang et al. | |
| 2004/0027121 A1* | 2/2004 | Choi | G01R 33/04 324/253 |
| 2004/0124836 A1 | 7/2004 | Kang et al. | |
| 2005/0077585 A1* | 4/2005 | Park | G01R 33/02 257/427 |
| 2006/0033490 A1* | 2/2006 | Joisten | G01R 33/05 324/249 |
| 2006/0115918 A1* | 6/2006 | Shim | H01F 41/046 438/48 |
| 2007/0085535 A1* | 4/2007 | Na | G01R 33/05 324/253 |
| 2007/0222441 A1 | 9/2007 | Satoh | |
| 2007/0257669 A1* | 11/2007 | Delevoye | G01R 33/04 324/253 |
| 2008/0316647 A1* | 12/2008 | Joisten | G01R 33/05 360/125.01 |
| 2009/0066326 A1* | 3/2009 | Itoi | G01R 33/18 324/260 |
| 2009/0243609 A1 | 10/2009 | Hasunuma | |
| 2009/0278533 A1* | 11/2009 | Chang | G01R 33/0206 324/247 |
| 2012/0151786 A1 | 7/2012 | Ohmori et al. | |
| 2012/0268114 A1 | 10/2012 | Disselnkotter | |
| 2012/0313638 A1 | 12/2012 | Patak et al. | |
| 2013/0056847 A1* | 3/2013 | Chen | H01F 17/0013 257/E29.325 |
| 2013/0064991 A1* | 3/2013 | Ohmori | G01R 33/04 427/547 |
| 2013/0141089 A1* | 6/2013 | Dyer | G01R 33/0052 324/252 |
| 2014/0191829 A1* | 7/2014 | Chiba | H01F 27/041 335/299 |
| 2014/0218147 A1* | 8/2014 | Chatani | H01F 27/22 336/20 |
| 2015/0137932 A1* | 5/2015 | Chen | H01F 17/0013 336/212 |
| 2015/0338474 A1* | 11/2015 | Mohan | G01R 33/0052 438/57 |
| 2016/0154069 A1* | 6/2016 | Eissa | G01R 33/04 324/253 |
| 2016/0307991 A1* | 10/2016 | Kuo | H01L 23/645 |
| 2017/0175259 A1 | 6/2017 | Lee et al. | |
| 2017/0213956 A1 | 7/2017 | Fissa et al. | |
| 2017/0234942 A1 | 8/2017 | Lavangkul et al. | |
| 2017/0267521 A1 | 9/2017 | Stringer et al. | |
| 2018/0096784 A1* | 4/2018 | Lee | H01L 23/5226 |
| 2018/0137969 A1* | 5/2018 | Hamamura | G01R 33/0076 |

\* cited by examiner

LAYOUTS FOR INTERLEVEL CRACK PREVENTION IN FLUXGATE TECHNOLOGY MANUFACTURING

CROSS REFERENCE TO RELATED APPLICATIONS

Under 35 U.S.C. § 120, this continuation application claims the benefit of and priority to U.S. patent application Ser. No. 15/042,119, filed Nov. 11, 2016, the entirety of which is hereby incorporated herein by reference.

FIELD

This disclosure relates to the field of microelectronic devices. More particularly, this disclosure relates to fluxgate magnetometer sensors in microelectronic devices.

BACKGROUND

Fluxgate magnetometer sensors in microelectronic devices have thin film magnetic material in the fluxgate cores embedded in dielectric material. The fluxgate cores are typically more than a micron thick to provide a desired sensitivity for the sensor. There is commonly stress in the thin film magnetic material from the deposition process, and there is further stress from thermal cycling of the integrated fluxgate device due to thermal expansion mismatch between the fluxgate core and the surrounding dielectric material, which frequently causes mechanical failure of the sensor, such as cracking of the dielectric material surrounding the fluxgate core.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

An integrated fluxgate device containing a fluxgate magnetometer sensor has a fluxgate core of a thin film magnetic material. The fluxgate magnetometer sensor has a crack-resistant structure at an end of the fluxgate core. The crack-resistant structure includes at least one of a laterally rounded contour of the fluxgate core at the end having corner radii of at least 2 microns, a lower metal end structure in the lower dielectric layer extending under the end of the fluxgate core, or an upper metal end structure in the upper dielectric layer extending over the end of the fluxgate core.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

An integrated fluxgate device containing a fluxgate magnetometer sensor has a fluxgate core of a thin film magnetic material. The fluxgate magnetometer sensor has a crack-resistant structure at an end of the fluxgate core. The crack-resistant structure includes at least one of a laterally rounded contour of the fluxgate core at the end having corner radii of at least 2 microns, a lower metal end structure extending under the end of the fluxgate core, or an upper metal end structure in the upper dielectric layer extending over the end of the fluxgate core. Tests performed in pursuit of the instant disclosure have shown corner radii of at least 2 microns to be effective in reducing instances of cracks in dielectric material surrounding the fluxgate core. The lower metal end structure and the upper metal end structure may include winding segments of windings around the fluxgate core. The lower metal end structure and the upper metal end structure may be electrically coupled to the windings. Alternatively, the lower metal end structure and the upper metal end structure may be electrically isolated from the windings.

For the purposes of this disclosure, the terms "lateral" and "laterally" are understood to refer to a direction parallel to a plane of a top surface of the integrated fluxgate device, and the terms "vertical" and "vertically" are understood to refer to a direction perpendicular to the plane of the top surface of the integrated fluxgate device.

Figure 1:
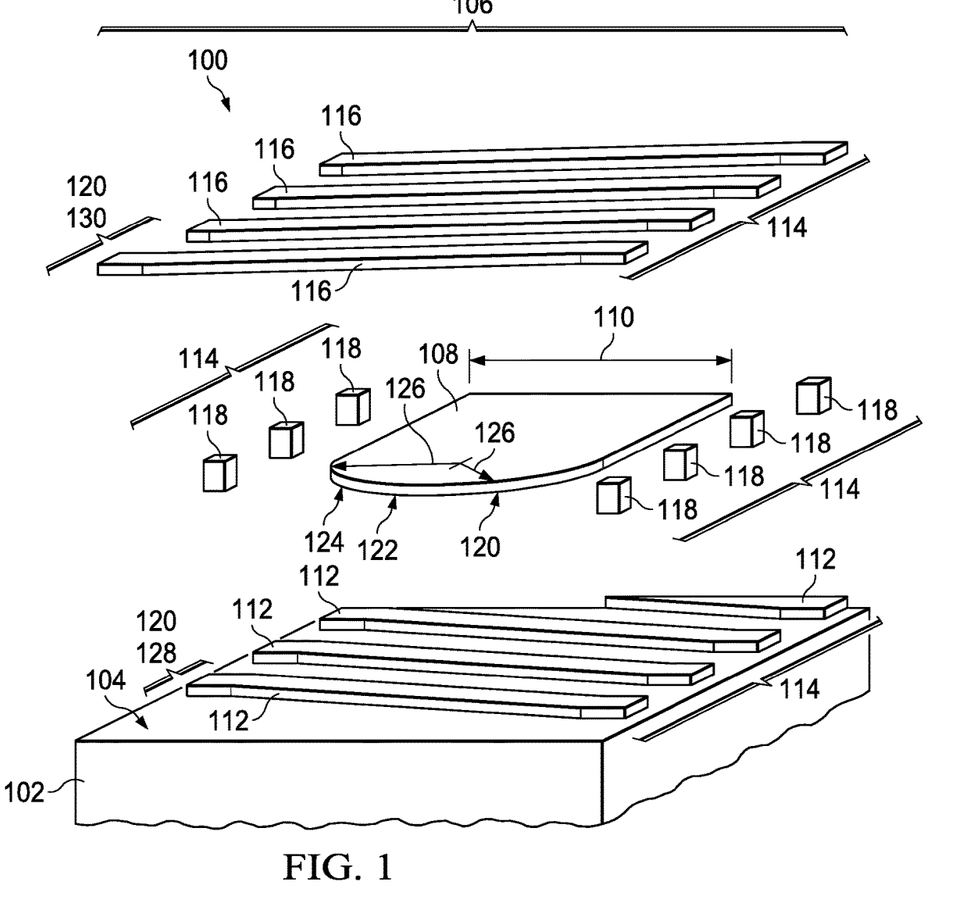
FIG. 1 is an exploded view of an example integrated fluxgate device containing a fluxgate magnetometer sensor.

FIG. 1 is an exploded view of an example integrated fluxgate device containing a fluxgate magnetometer sensor. The integrated fluxgate device 100 is formed on a substrate 102. The substrate 102 may include a semiconductor material such as silicon. A top surface 104 of the substrate 102 includes dielectric material such as silicon dioxide or silicon nitride. The dielectric material may be, for example, an inter-level dielectric (ILD) of an interconnect region of the integrated fluxgate device 100. Interconnects such as vias may be exposed at the top surface 104. The integrated fluxgate device 100 may include electronic circuits with active components such as transistors which are part of the fluxgate magnetometer sensor 106, referred to herein as the fluxgate sensor 106.

The fluxgate sensor 106 includes a fluxgate core 108 of thin film magnetic material. The fluxgate core 108 may be, for example, 1 micron to 3 microns thick. A width 110 of the fluxgate core 108 may be, for example, 10 microns to 500 microns. Increasing the thickness and the width 110 of the fluxgate core 108 may desirably improve the sensitivity of the fluxgate sensor 106, but may undesirably increase a size and cost of the integrated fluxgate device 100. The thickness and the width 110 may be selected to provide a desired balance between sensitivity and cost.

The fluxgate sensor 106 includes lower winding segments 112 of windings 114 around the fluxgate core 108. The lower winding segments 112 include metal, and may be part of an interconnect level of the integrated fluxgate device 100. The lower winding segments 112 are disposed under the fluxgate core 108. The fluxgate sensor 106 further includes upper winding segments 116 of the windings 114. The upper winding segments 116 also include metal, and may be part of another interconnect level of the integrated fluxgate device 100. The upper winding segments 116 are disposed over the fluxgate core 108. The upper winding segments 116 may be electrically coupled to the lower winding segments 112 through vias 118 of the windings 114. The vias 118 include metal and may be part of a via level of the integrated fluxgate device 100. The windings 114, including the lower winding segments 112, the upper winding segments 116 and the vias 118, are electrically isolated from the fluxgate core 108 by layers of dielectric material, not shown in FIG. 1 in order to more clearly depict the spatial relationship between the fluxgate core 108, the lower winding segments 112, the upper winding segments 116 and the vias 118.

The fluxgate sensor 106 has a crack-resistant structure 120 at an end 122 of the fluxgate core 108. In the instant example, the crack-resistant structure 120 includes a laterally rounded contour 124 of the fluxgate core 108 having corner radii 126 of at least 2 microns. In the instant example, the corner radii 126 are approximately equal to half the width 110 of the fluxgate core 108 at the end 122, so that the fluxgate core 108 has a semicircular shape at the end 122. In the instant example, the crack-resistant structure 120 includes a lower metal end structure 128 which extends under the end 122 of the fluxgate core 108. In the instant example, the lower metal end structure 128 includes at least one of the lower winding segments 112 which extend under the end 122 of the fluxgate core 108. In the instant example, the crack-resistant structure 120 includes an upper metal end structure 130 which extends over the end 122 of the fluxgate core 108. In the instant example, the upper metal end structure 130 includes at least one of the upper winding segments 116 which extend over the end 122 of the fluxgate core 108. Forming the lower metal end structure 128 and the upper metal end structure 130 of the crack-resistant structure 120 of the lower winding segments 112 and the upper winding segments 116, respectively, may advantageously improve a sensitivity of the fluxgate sensor 106. Forming the fluxgate core 108 with corner radii 126 approximately equal to half the width 110 of the fluxgate core 108 may advantageously provide increased crack resistance compared to smaller corner radii.

Each end 122 of the fluxgate core 108 may have a version of the crack resistant structure 120. The crack-resistant structure 120 at a first end 122 may be different from the crack-resistant structure 120 at a second end 122. The fluxgate sensor 106 may contain more than one fluxgate core 108. For example, the fluxgate sensor 106 may be a differential sensor with two fluxgate cores 108. Each end 122 of each fluxgate core 108 may have a version of the crack resistant structure 120. Further, the integrated fluxgate device 100 may include more than one fluxgate sensor 106, for example to measure magnetic field components along perpendicular axes. The crack-resistant structure 120 may be formed at each end 122 of each fluxgate core 108 in the integrated fluxgate device 100.

Figure 2A:
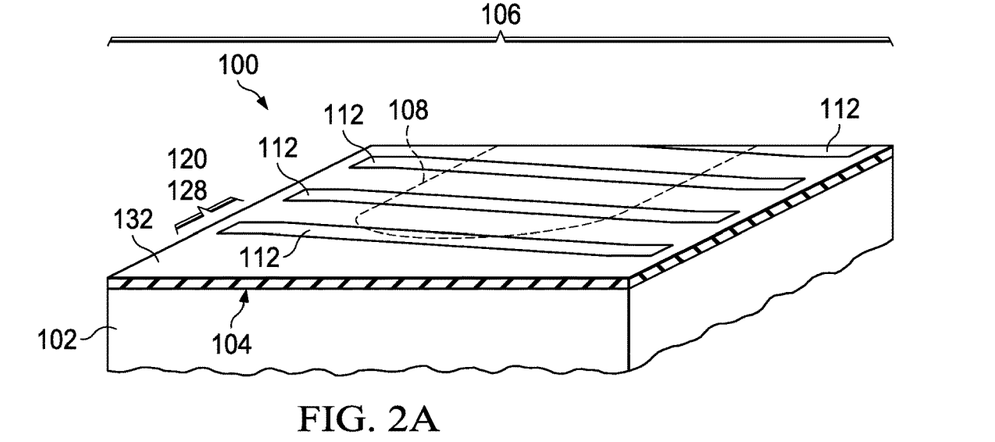
FIG. 2A through FIG. 2G depict an example method of forming the structure of FIG. 1.

FIG. 2A through FIG. 2G depict an example method of forming the structure of FIG. 1. Referring to FIG. 2A, the substrate 102 of the integrated fluxgate device 100 may be, for example, part of a semiconductor wafer such as a silicon wafer, or may be part of a dielectric substrate such as ceramic or sapphire, containing additional integrated fluxgate devices. In the instant example, a first intra-metal dielectric (IMD) layer 132 is formed over the top surface 104 of the substrate 102. The first IMD layer 132 may be, for example, 2 microns to 4 microns thick, and may include a main layer of silicon dioxide, and optionally an etch stop layer of silicon nitride, silicon carbide nitride or silicon carbide, and optionally a cap layer of silicon nitride or silicon carbide nitride. Silicon dioxide in the first IMD layer 132 may be formed by a plasma enhanced chemical vapor deposition (PECVD) process using tetraethyl orthosilicate (TEOS). Silicon nitride in the first IMD layer 132 may be formed by a PECVD process using bis(tertiary-butyl-amino) silane (BTBAS).

Trenches for the lower winding segments 112 are formed through the first IMD layer 132 using reactive ion etch (RIE) processes, for a damascene process of forming the lower winding segments 112. The trenches may expose tops of vias at the top surface 104 of the substrate 102. A metal liner of tantalum and/or tantalum nitride is formed over the first IMD layer 132, extending into the trenches to provide a barrier for the lower winding segments 112. A seed layer of copper is formed on the metal liner by a sputter process, and additional copper is formed on the seed layer by electroplating, filling the trenches with copper. Excess copper and the metal liner are removed from over a top surface of the first IMD layer 132 by a copper chemical mechanical polish (CMP) process, leaving the copper and metal liner in the trenches to form the lower winding segments 112. The lower winding segments 112 extend past the area for the fluxgate core 108 of FIG. 1, outlined in FIG. 2A by a dashed border. Instances of the lower winding segments 112 extending under an end of the fluxgate core 108 are part of the lower metal end structure 128 of the crack-resistant structure 120. Forming the lower metal end structure 128 concurrently with the lower winding segments 112 may advantageously reduce a fabrication cost of the integrated fluxgate device 100.

Figure 2B:
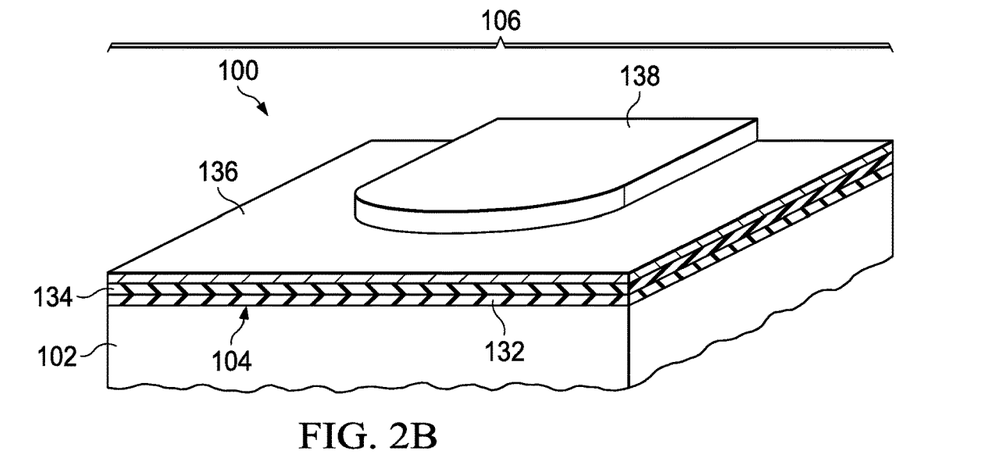

Referring to FIG. 2B, a lower ILD layer 134 is formed over the first IMD layer 132 and over the lower winding segments 112 of FIG. 2A. The lower ILD layer 134 may be, for example, 0.5 microns to 1 micron thick, and may include a main layer of silicon dioxide and optionally an etch stop layer. The lower ILD layer 134 includes a cap layer of silicon nitride to provide a lower barrier for the fluxgate core 108 of FIG. 1. The lower ILD layer 134 may be formed by PECVD processes, as described in reference to FIG. 2A.

A layer of magnetic material 136 for the fluxgate core 108 of FIG. 1 is formed over the lower ILD layer 134. The layer of magnetic material 136 may include a stack of alternating sub-layers of iron nickel and aluminum nitride. The layer of magnetic material 136 may be, for example, 1 micron to 2 microns thick, to provide a desired sensitivity for the fluxgate sensor 106.

An etch mask 138 is formed over the layer of magnetic material 136 to cover the area for the fluxgate core 108. The etch mask 138 may include photoresist formed by a photolithographic process, and may optionally include a layer of anti-reflection material such as a bottom anti-reflection coat (BARC). The etch mask 138 has rounded corners with radii greater than 2 microns.

Figure 2C:
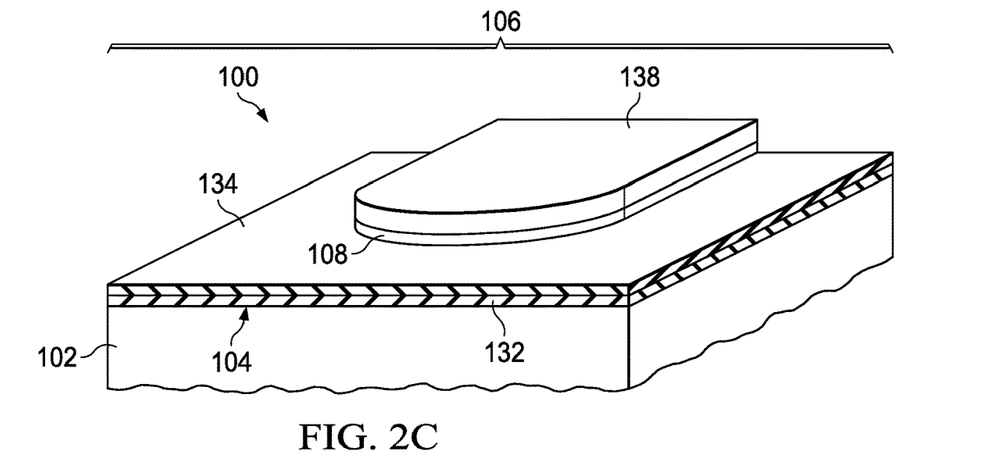

Referring to FIG. 2C, an etch process removes the magnetic material from the layer of magnetic material 136 of FIG. 2B in the area exposed by the etch mask 138. The magnetic material remaining under the etch mask 138 forms the fluxgate core 108. The etch process may be, for example, a wet etch process which is selective to the cap layer of silicon nitride at a top of the lower ILD layer 134.

Figure 2D:
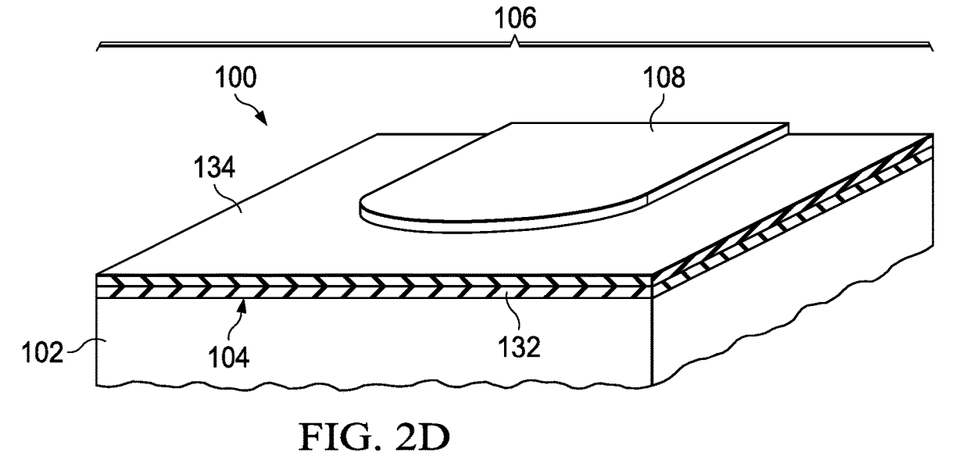

Referring to FIG. 2D, the etch mask 138 of FIG. 2C is removed, leaving the fluxgate core 108 in place over the lower ILD layer 134. The etch mask 138 may be removed, for example, using an ash process.

Figure 2E:
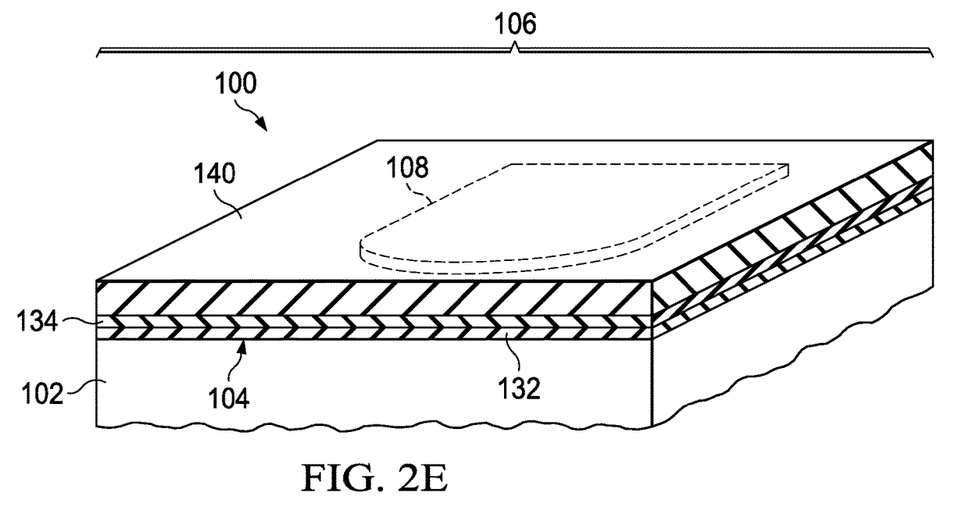

Referring to FIG. 2E, an upper ILD layer 140 is formed over the lower ILD layer 134 and over the fluxgate core 108. The upper ILD layer 140 includes a layer of silicon nitride to provide an upper barrier over the fluxgate core 108. The upper ILD layer 140 further includes a main layer of silicon dioxide over the layer of silicon nitride, 2 microns to 4 microns thick. The main layer of silicon dioxide is planarized, for example by an oxide CMP process, to provide a suitable surface for subsequently forming the upper winding segments 116 of FIG. 1 by a damascene process. The upper ILD layer 140 includes a cap layer of silicon nitride over the main layer of silicon dioxide. The upper ILD layer 140 may be formed by PECVD processes, as described in reference to FIG. 2A.

Figure 2F:
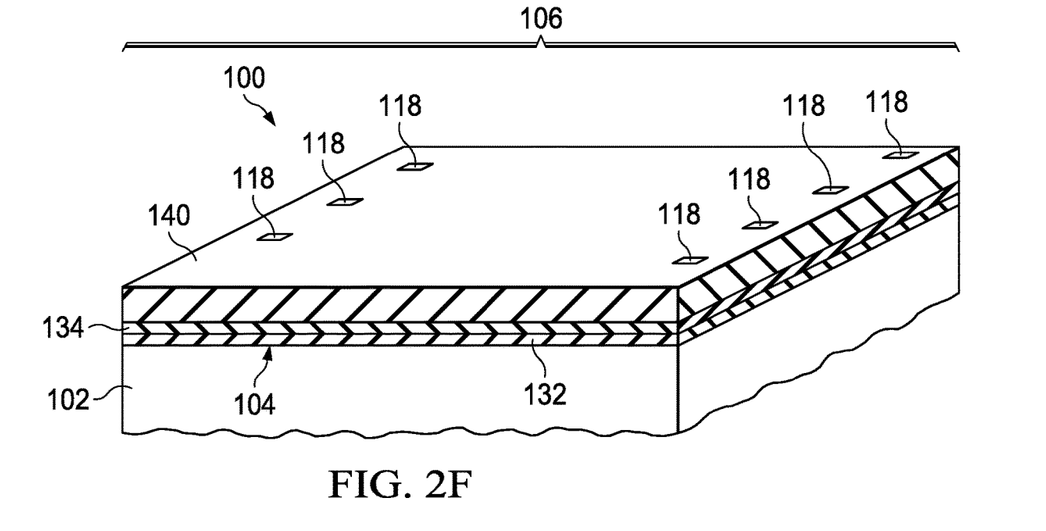

Referring to FIG. 2F, the vias 118 are formed through the upper ILD layer 140 and through the lower ILD layer 134 to make electrical connections to the lower winding segments 112 of FIG. 2A. The vias 118 may be formed by a copper damascene process as described in reference to FIG. 2A. Alternatively, the vias 118 may be formed by a tungsten damascene process, with a metal liner of titanium and titanium nitride, and fill layer of tungsten formed by a metal organic chemical vapor deposition (MOCVD) process using tungsten hexafluoride reduced by silane and hydrogen.

Figure 2G:
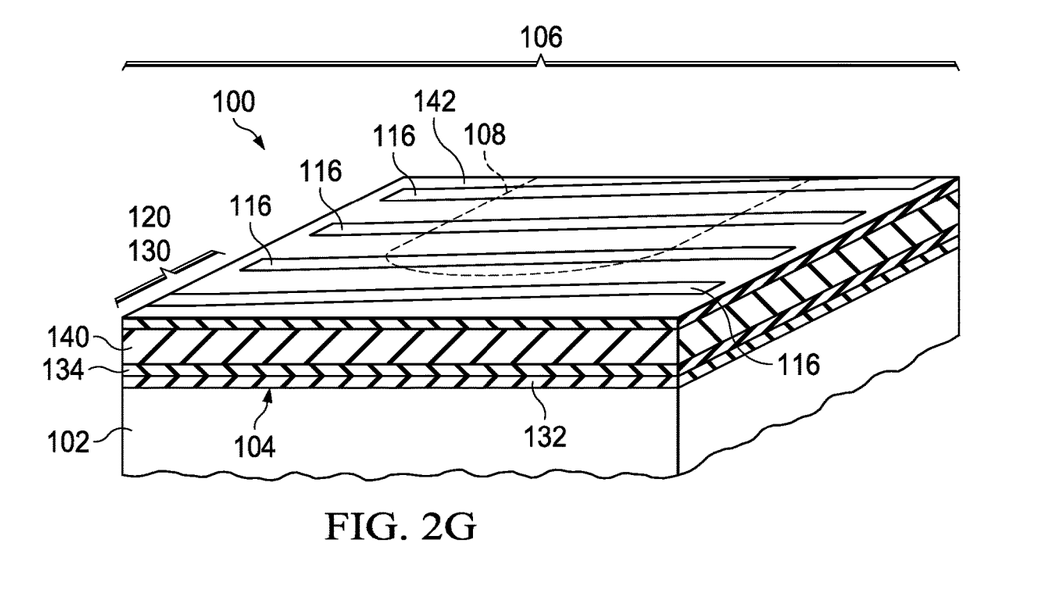

Referring to FIG. 2G, a second IMD layer 142 is formed over the upper ILD layer 140. The second IMD layer 142 may have a similar thickness, structure and composition to the first IMD layer 132, and may be formed by similar processes, as described in reference to FIG. 2A. Trenches for the upper winding segments 116 are formed through the second IMD layer 142 using RIE processes. The trenches for the upper winding segments 116 expose tops of the vias 118 of FIG. 2F. The upper winding segments 116 are formed in the trenches by a copper damascene process, as described in reference to FIG. 2A. The upper winding segments 116 extend past the area for the fluxgate core 108 of FIG. 1, outlined in FIG. 2G by a dashed border. Instances of the upper winding segments 116 extending over an end of the fluxgate core 108 are part of the upper metal end structure 130 of the crack-resistant structure 120. Forming the upper metal end structure 130 concurrently with the upper winding segments 116 may advantageously reduce the fabrication cost of the integrated fluxgate device 100. Forming the lower metal end structure 128 of FIG. 1 and the upper metal end structure 130 of copper may advantageously improve the crack resistance of the crack-resistant structure 120, due to the high shear stress limit of copper compared to other commonly used interconnect metals.

Additional steps may be performed to complete fabrication of the integrated fluxgate device 100. For example, a protective overcoat may be formed over the fluxgate sensor 106. Bond pads may be formed in the protective overcoat to provide electrical connections to components in the integrated fluxgate device 100.

Figure 3:
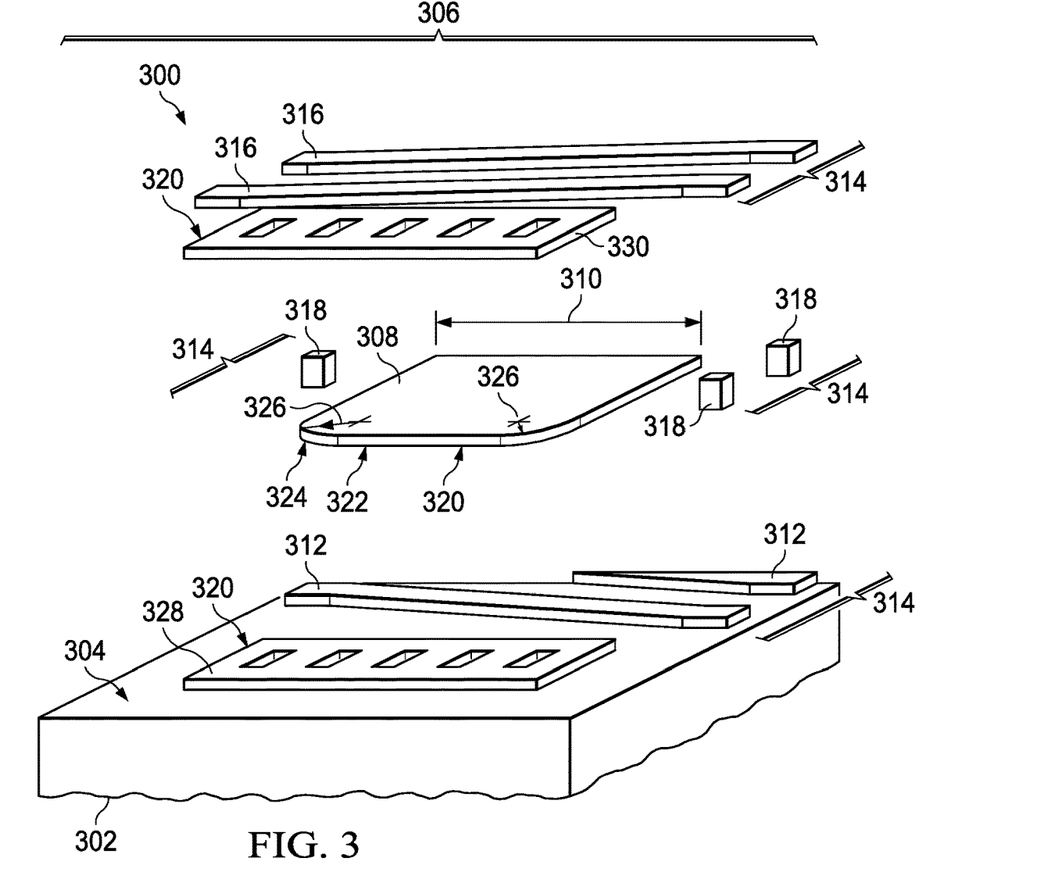
FIG. 3 is an exploded view of another example integrated fluxgate device containing a fluxgate magnetometer sensor.

FIG. 3 is an exploded view of another example integrated fluxgate device containing a fluxgate magnetometer sensor. The integrated fluxgate device 300 is formed on a substrate 302. The substrate 302 may include a semiconductor material such as silicon. A top surface 304 of the substrate 302 includes dielectric material, possibly a top layer of an ILD layer of the integrated fluxgate device 300. Vias may be exposed at the top surface 304. The integrated fluxgate device 300 may include electronic circuits which are part of the fluxgate magnetometer sensor 306, referred to herein as the fluxgate sensor 306.

The fluxgate sensor 306 includes a fluxgate core 308 of thin film magnetic material. The fluxgate core 308 may have a thickness of 1 micron to 3 microns thick, and a width 310 of 10 microns to 500 microns. The thickness and the width 310 may be selected to provide a desired balance between sensitivity and cost, as described in reference to FIG. 1. The fluxgate sensor 306 includes lower winding segments 312 of windings 314 around the fluxgate core 308. The lower winding segments 312 include metal. The lower winding segments 312 are disposed under the fluxgate core 308. In the instant example, the lower winding segments 312 do not extend to an end 322 of the fluxgate core 308. The fluxgate sensor 306 further includes upper winding segments 316 of the windings 314. The upper winding segments 316 also include metal. The upper winding segments 316 are disposed over the fluxgate core 308. In the instant example, the upper winding segments 316 do not extend to the end 322 of the fluxgate core 308. The upper winding segments 316 may be electrically coupled to the lower winding segments 312 through vias 318 of the windings 314. The vias 318 include metal. The windings 314, including the lower winding segments 312, the upper winding segments 316 and the vias 318, are electrically isolated from the fluxgate core 308 by layers of dielectric material, not shown in FIG. 3 in order to more clearly depict the spatial relationship between the fluxgate core 308 and the windings 314.

The fluxgate sensor 306 has a crack-resistant structure 320 at an end 322 of the fluxgate core 308. In the instant example, the crack-resistant structure 320 includes a laterally rounded contour 324 of the fluxgate core 308 having corner radii 326 of at least 2 microns. In the instant example, the corner radii 326 are less than half the width 310 of the fluxgate core 308 at the end 322, which may advantageously reduce an area of the fluxgate core 308, hence reducing an area of the integrated fluxgate device 300 and so possibly further reducing a fabrication cost of the integrated fluxgate device 300.

In the instant example, the crack-resistant structure 320 includes a lower metal end structure 328 which extends under the end 322 of the fluxgate core 308. In the instant example, the lower metal end structure 328 is separate from the lower winding segments 312. The lower metal end structure 328 may be a single metal element, possibly with slots, as depicted in FIG. 3. The metal in the lower metal end structure 328 occupies at least 50 percent of an area directly under the end 322 of the fluxgate core 308, starting at the lower winding segments 312, to provide effective crack resistance. The lower metal end structure 328 may be in an interconnect level containing the lower winding segments 312, possibly reducing the fabrication cost.

In the instant example, the crack-resistant structure 320 includes an upper metal end structure 330 which extends over the end 322 of the fluxgate core 308. In the instant example, the upper metal end structure 330 is separate from the upper winding segments 316. The upper metal end structure 330 may be a single metal element, possibly with slots, as depicted in FIG. 3. The metal in the upper metal end structure 330 occupies at least 50 percent of an area directly over the end 322 of the fluxgate core 308, starting at the upper winding segments 316, to provide further effective crack resistance. The upper metal end structure 330 may be in another interconnect level containing the upper winding segments 316, possibly further reducing the fabrication cost.

Figure 4A:
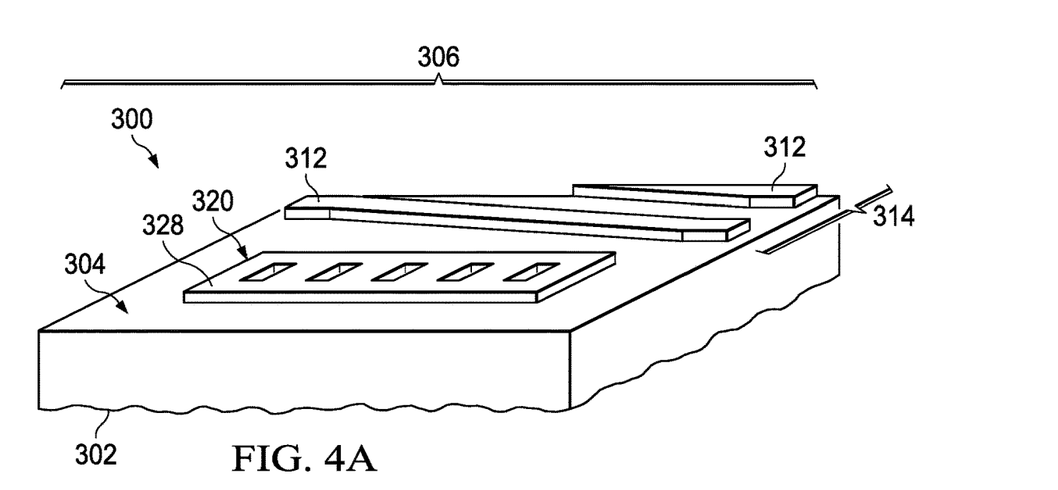
FIG. 4A through FIG. 4G depict an example method of forming the structure of FIG. 3.

FIG. 4A through FIG. 4G depict an example method of forming the structure of FIG. 3. Referring to FIG. 4A, the substrate 302 of the integrated fluxgate device 300 may be, for example, part of a semiconductor wafer such as a silicon wafer, or may be part of a dielectric substrate such as ceramic or sapphire, containing additional integrated fluxgate devices. In the instant example, the lower winding segments 312 and the lower metal end structure 328 are formed over the top surface 304 of the substrate 302 by an etched aluminum process. An example etched aluminum process of forming the lower winding segments 312 and the lower metal end structure 328 starts with forming a layer of interconnect metal over the top surface 304. The layer of interconnect metal may include, for example, an adhesion layer of titanium nitride, a layer of aluminum with a few percent copper, silicon and/or titanium, 1 micron to 3 microns thick, and an anti-reflection layer of titanium nitride. An etch mask of photoresist is formed over the layer of interconnect metal which covers areas for the lower winding segments 312 and the lower metal end structure 328. An RIE process using chlorine radicals is used to remove the layer of interconnect where exposed by the etch mask. The etch mask is subsequently removed, for example by an ash process, leaving the lower winding segments 312 and the lower metal end structure 328 over the top surface 304 of the substrate 302.

Figure 4B:
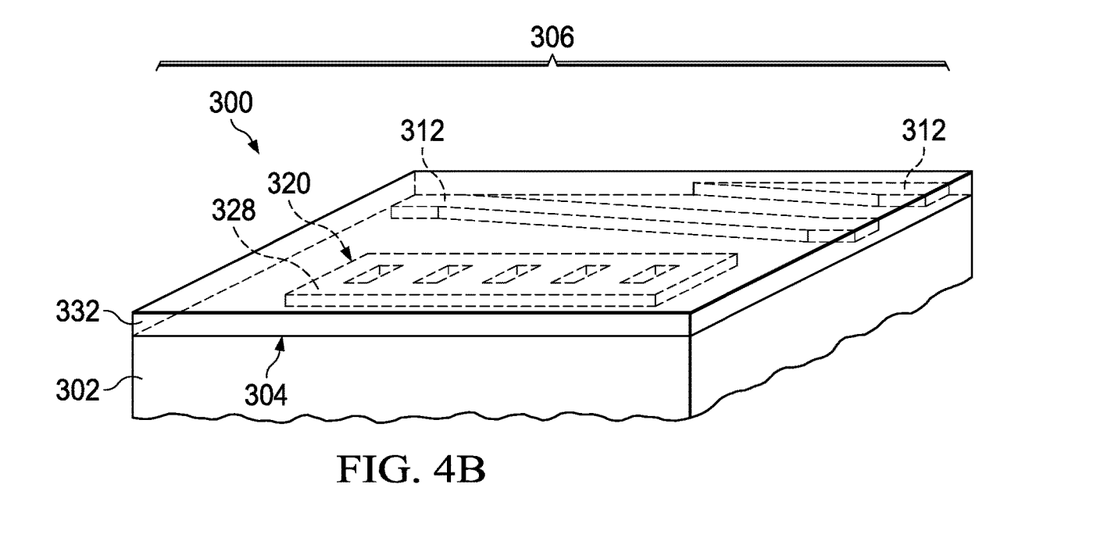

Referring to FIG. 4B, a first IMD layer 332 is formed over the lower winding segments 312 and the lower metal end structure 328, and over exposed areas of the top surface 304 of the substrate 302. The first IMD layer 332 may include, for example, a conformal layer of silicon nitride to provide a diffusion barrier on the aluminum layer in the lower winding segments 312 and the lower metal end structure 328, and a layer of silicon dioxide on the layer of silicon nitride. The layer of silicon dioxide may be thicker than the lower winding segments 312 and the lower metal end structure 328, and subsequently planarized by an oxide CMP process. Silicon nitride and silicon dioxide in the first IMD layer 332 may be formed by PECVD processes.

Figure 4C:
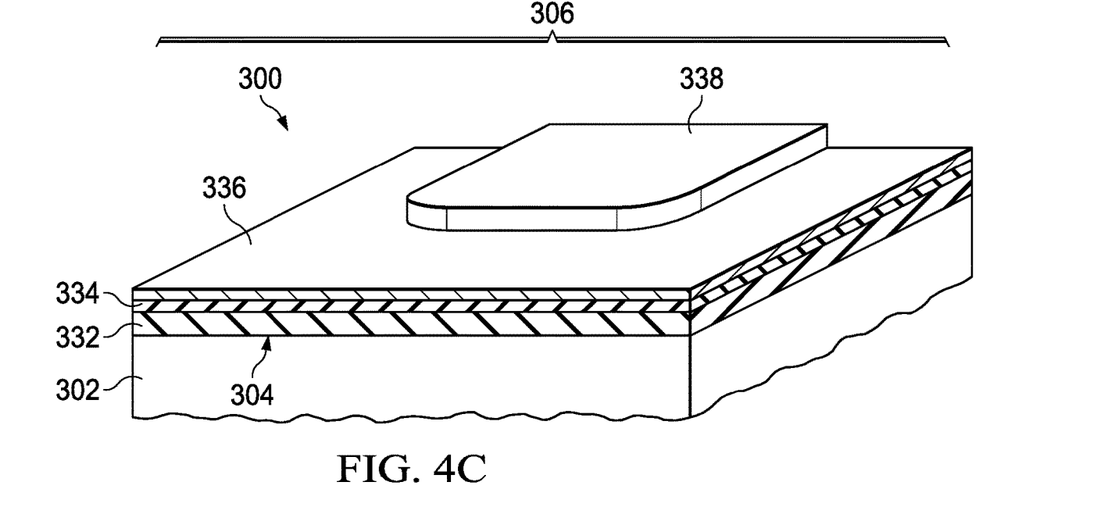

Referring to FIG. 4C, a lower ILD layer 334 is formed over the first IMD layer 332 of FIG. 4B. The lower ILD layer 334 may be formed as described in reference to FIG. 2B. A layer of magnetic material 336 for the fluxgate core 308 of FIG. 3 is formed over the lower ILD layer 334. The layer of magnetic material 336 may have a similar structure and composition to the layer of magnetic material described in reference to FIG. 2B. An etch mask 338 is formed over the layer of magnetic material 336 to cover the area for the fluxgate core 308.

Figure 4D:
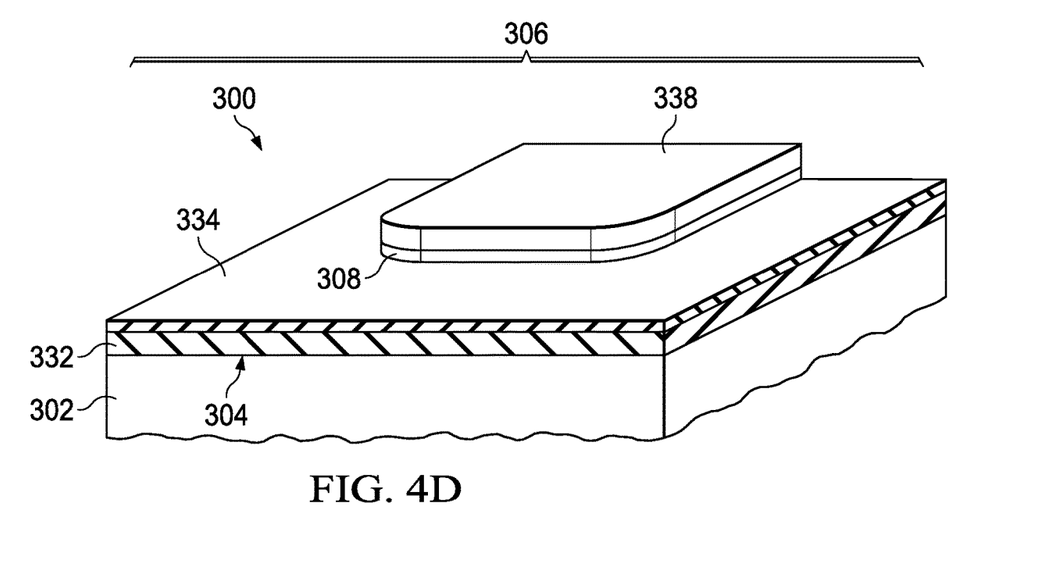

Referring to FIG. 4D, an etch process removes the magnetic material from the layer of magnetic material 336 of FIG. 4C in the area exposed by the etch mask 338 to form the fluxgate core 308. The etch process may be a wet etch process. The etch mask 338 is subsequently removed.

Figure 4E:
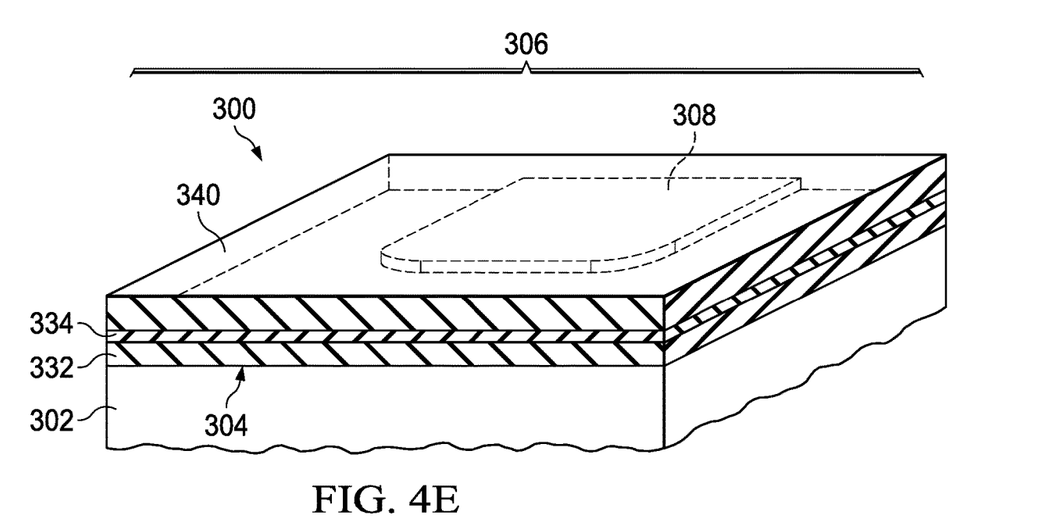

Referring to FIG. 4E, an upper ILD layer 340 is formed over the lower ILD layer 334 and over the fluxgate core 308. The upper ILD layer 340 includes a layer of silicon nitride and a main layer of silicon dioxide over the layer of silicon nitride, as described in reference to FIG. 2E. The main layer of silicon dioxide is planarized. The upper ILD layer 340 may include a cap layer of silicon nitride over the main layer of silicon dioxide. The upper ILD layer 340 may be formed by PECVD processes.

Figure 4F:
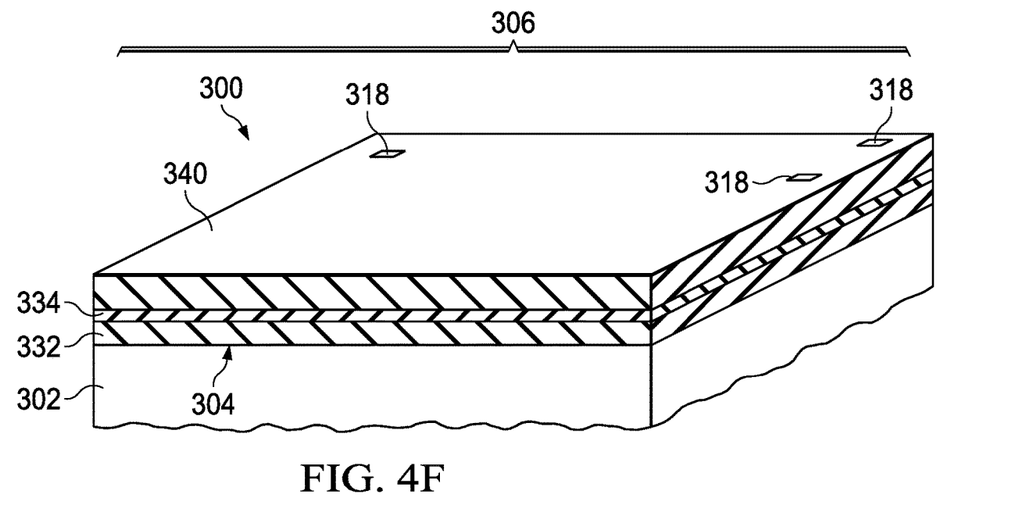

Referring to FIG. 4F, the vias 318 are formed through the upper ILD layer 340 and through the lower ILD layer 334 to make electrical connections to the lower winding segments 312 of FIG. 4A. The vias 318 may be formed by a tungsten damascene process, with a metal liner of titanium and titanium nitride, and fill layer of tungsten formed by an MOCVD process using tungsten hexafluoride reduced by silane and hydrogen. A tungsten etchback process or a tungsten CMP process removes the metal liner and tungsten from over a top surface of the upper ILD layer 340, leaving the vias 318.

Figure 4G:
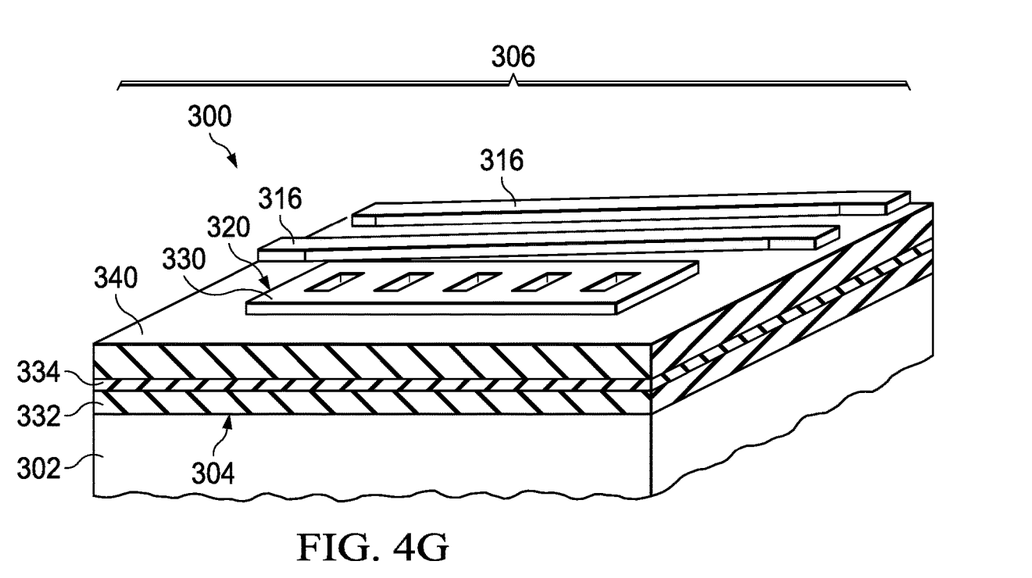

Referring to FIG. 4G, the upper winding segments 316 and the upper metal end structure 330 are formed over the upper ILD layer 340. The upper winding segments 316 make electrical connections to the vias 318 of FIG. 4F. The upper winding segments 316 and the upper metal end structure 330 may be formed by a similar process used for the lower winding segments 312 and the lower metal end structure 328 of FIG. 3, as described in reference to FIG. 4A. A second IMD layer, not shown, may be formed over the upper winding segments 316 and the upper metal end structure 330. A protective overcoat and bond pads may be subsequently formed to complete fabrication of the integrated fluxgate device 300.

The structure of FIG. 1 may be formed using the method of FIG. 4A through FIG. 4G. The structure of FIG. 3 may be formed by the method of FIG. 2A through FIG. 2G. Alternatively, the structure of FIG. 1 and/or the structure of FIG. 3 may be formed using a masked plating process, in which a seed layer of metal is formed on an existing top surface of the integrated fluxgate device. A plating mask is formed which exposes areas for the lower winding segments and the lower metal end structure; the plating mask may include photoresist formed by a photolithographic process. The lower winding segments and the lower metal end structure are formed by electroplating metal such as copper on the seed layer in the areas exposed by the plating mask. The plating mask is subsequently removed, and the seed layer is removed where exposed by the lower winding segments and the lower metal end structure. The upper winding segments and the upper metal end structure may be formed by a similar process. The crack-resistant structures described herein may also be formed at other high stress locations around the fluxgate cores, in addition to the ends of the fluxgate cores.

While various embodiments of the present disclosure have been described above, it should be understood that they have been presented by way of example only and not limitation. Numerous changes to the disclosed embodiments can be made in accordance with the disclosure herein without departing from the spirit or scope of the invention. Thus, the breadth and scope of the present disclosure should not be limited by any of the above described embodiments. Rather, the scope of the disclosure should be defined in accordance with the following claims and their equivalents.

What is claimed is:

1. A method of forming an integrated fluxgate device, comprising:
   forming a fluxgate core over a top surface of a dielectric layer over a semiconductor substrate;
   forming at least three upper winding segments in an upper metal level above the fluxgate core and the top surface;
   forming at least three lower winding segments in a lower metal level between the fluxgate core and the top surface;
   connecting the upper winding segments to the lower winding segments by first and second rows of vias, each via connecting an end of one of the upper winding segments to an end of one of the lower winding segments, the first and second rows oriented parallel to a first axis, and the fluxgate core having a length along the first axis and a width along a second axis orthogonal to the first axis; and forming a metal structure that overlaps an edge of the fluxgate core that intersects the first axis at an end of the fluxgate core, the metal structure being in the upper or lower metal level and conductively isolated from any other metal feature in the upper and lower metal levels.

2. The method of claim 1, wherein the metal structure is a first metal structure in the upper metal level, and further comprising forming a second metal structure in the lower metal level, the second metal structure overlapping the edge of the fluxgate core and being conductively isolated from any metal feature in a different metal level.

3. The method of claim 1, wherein a fluxgate core edge has a rounded contour.

4. The method of claim 3, wherein the fluxgate core edge has a radius of curvature about equal to half of a width of the fluxgate core.

5. The method of claim 1, wherein the metal structure includes a polygon having at least one slot therethrough.

6. The method of claim 5, wherein the at least one slot includes a plurality of slots that repeat along a direction perpendicular to the first axis.

7. The method of claim 1, wherein the winding segments and the metal structure are copper damascene structures.

8. The method of claim 1, wherein the upper and lower winding segments and the metal structure are etched aluminum structures.

9. The method of claim 1, wherein the upper winding segments or the lower winding segments extend past the end of the fluxgate core in a direction parallel to the first axis.

10. A method of forming a fluxgate magnetometer sensor, comprising:

forming at least three lower winding segments in a first metal level at a first height over a dielectric layer above a semiconductor substrate;

forming a fluxgate core at a second height over the dielectric layer greater than the first height;

forming at least three upper winding segments in a second metal level at a third height over the dielectric layer greater than the second height;

forming first and second rows of vias parallel to a first axis, each via connecting one of the lower winding segments to one of the upper winding segments, and the fluxgate core having a length along the first axis and a width along a second axis orthogonal to the first axis; and forming a metal structure over the substrate, the metal structure located in the first metal level or the second metal level and overlapping an edge of the fluxgate core that intersects the first axis at an end of the fluxgate core, the metal structure being in the upper or lower metal level and conductively isolated from any other metal feature in the first and the second metal levels.

11. The method of claim 10, wherein the metal structure is a lower metal structure in the first metal level, and further comprising forming an upper metal structure in the second metal level, the upper metal structure overlapping the edge of the fluxgate core and being conductively isolated from any other metal feature in the first and the second metal levels.

12. The method of claim 10, wherein the metal structure includes a polygon having at least one slot therethrough.

13. The method of claim 10, wherein the upper and lower winding segments and the metal structure include etched aluminum.

14. The method of claim 10, wherein the upper winding segments or the lower winding segments extend past the end of the fluxgate core in a direction parallel to the first axis.

* * * * *